United States Patent
King et al.

(10) Patent No.: US 9,192,054 B2
(45) Date of Patent: Nov. 17, 2015

(54) APPARATUS FOR ANISOTROPIC FOCUSING

(75) Inventors: Bruce H. King, Albuquerque, NM (US);
Steven Barry Woolfson, Boston, MA (US); David H. Ramahi, Boston, MA (US)

(73) Assignee: Optomec, Inc., Albuquerque, NM (US)

( * ) Notice: Subject to any disclaimer, the term of this patent is extended or adjusted under 35 U.S.C. 154(b) by 720 days.

(21) Appl. No.: 12/203,069

(22) Filed: Sep. 2, 2008

(65) Prior Publication Data
US 2009/0090298 A1 Apr. 9, 2009

Related U.S. Application Data

(60) Provisional application No. 60/969,445, filed on Aug. 31, 2007.

(51) Int. Cl.
| | |
|---|---|
| *B05B 7/04* | (2006.01) |
| *B05B 7/06* | (2006.01) |
| *B05B 7/08* | (2006.01) |
| *B05B 1/28* | (2006.01) |
| *H05K 3/12* | (2006.01) |
| *B05B 7/02* | (2006.01) |
| *B05B 15/04* | (2006.01) |

(52) U.S. Cl.
CPC .............. *H05K 3/125* (2013.01); *B05B 7/025* (2013.01); *B05B 7/0416* (2013.01); *B05B 7/0441* (2013.01); *B05B 7/0475* (2013.01); *B05B 7/066* (2013.01); *B05B 7/0807* (2013.01); *H05K 3/12* (2013.01); *B05B 7/0884* (2013.01); *B05B 15/0431* (2013.01); *H05K 2203/013* (2013.01)

(58) Field of Classification Search
None
See application file for complete search history.

(56) References Cited

U.S. PATENT DOCUMENTS

| | | | |
|---|---|---|---|
| 3,256,677 A * | 6/1966 | Boucher et al. | 239/3 |
| 3,474,971 A | 10/1969 | Goodrich | |
| 3,590,477 A | 7/1971 | Cheroff et al. | |
| 3,642,202 A | 2/1972 | Angelo | |
| 3,715,785 A | 2/1973 | Brown et al. | |
| 3,808,432 A | 4/1974 | Ashkin | |
| 3,808,550 A | 4/1974 | Ashkin | |
| 3,846,661 A | 11/1974 | Brown et al. | |
| 3,854,321 A | 12/1974 | Dahneke | |
| 3,901,798 A | 8/1975 | Peterson | |

(Continued)

FOREIGN PATENT DOCUMENTS

| | | |
|---|---|---|
| DE | 198 41 401 | 4/2000 |
| EP | 0 331 022 A2 | 9/1989 |

(Continued)

OTHER PUBLICATIONS

Renn, M. J. et al., "Laser-Guided Atoms in Hollow-Core Optical Fibers", *Physical Review Letters* Oct. 30, 1995, 3253-3256.

(Continued)

*Primary Examiner* — Dah-Wei D Yuan
*Assistant Examiner* — Binu Thomas
(74) *Attorney, Agent, or Firm* — Philip D. Askenazy; Jeffrey D. Myers; Peacock Myers, P.C.

(57) ABSTRACT

A substantially planar assembly for depositing material. The assembly comprises plates which, when assembled, define at least one aerosol channel, a sheath gas plenum, and a nozzle. These components are preferably anisotropic, and preferably rectangular. The aerosol channel may be divided further to improve uniformity of aerosol flow.

12 Claims, 9 Drawing Sheets

(56) References Cited

U.S. PATENT DOCUMENTS

| | | | |
|---|---|---|---|
| 3,959,798 A | 5/1976 | Hochberg et al. | |
| 3,974,769 A | 8/1976 | Hochberg et al. | |
| 3,982,251 A | 9/1976 | Hochberg | |
| 4,004,733 A | 1/1977 | Law | |
| 4,016,417 A | 4/1977 | Benton | |
| 4,019,188 A | 4/1977 | Hochberg | |
| 4,034,025 A | 7/1977 | Martner | |
| 4,036,434 A | 7/1977 | Anderson et al. | |
| 4,046,073 A | 9/1977 | Mitchell et al. | |
| 4,046,074 A | 9/1977 | Hochberg et al. | |
| 4,092,535 A | 5/1978 | Ashkin et al. | |
| 4,112,437 A | 9/1978 | Mir et al. | |
| 4,132,894 A | 1/1979 | Yule | |
| 4,171,096 A | 10/1979 | Welsh et al. | |
| 4,200,669 A | 4/1980 | Schaefer et al. | |
| 4,228,440 A | 10/1980 | Horike et al. | |
| 4,269,868 A | 5/1981 | Livsey | |
| 4,315,458 A * | 2/1982 | Hudson, III | 118/326 |
| 4,323,756 A | 4/1982 | Brown et al. | |
| 4,453,803 A | 6/1984 | Hidaka et al. | |
| 4,485,387 A | 11/1984 | Drumheller | |
| 4,497,692 A | 2/1985 | Gelchinski et al. | |
| 4,601,921 A | 7/1986 | Lee | |
| 4,605,574 A | 8/1986 | Yonehara et al. | |
| 4,670,135 A | 6/1987 | Marple et al. | |
| 4,689,052 A | 8/1987 | Ogren et al. | |
| 4,823,009 A | 4/1989 | Biemann et al. | |
| 4,825,299 A | 4/1989 | Okada et al. | |
| 4,826,583 A | 5/1989 | Biernaux et al. | |
| 4,893,886 A | 1/1990 | Ashkin et al. | |
| 4,904,621 A | 2/1990 | Loewenstein et al. | |
| 4,911,365 A | 3/1990 | Thiel et al. | |
| 4,917,830 A * | 4/1990 | Ortiz et al. | 239/338 |
| 4,920,254 A | 4/1990 | DeCamp et al. | |
| 4,947,463 A | 8/1990 | Matsuda et al. | |
| 4,971,251 A | 11/1990 | Dobrick et al. | |
| 4,997,809 A | 3/1991 | Gupta | |
| 5,032,850 A | 7/1991 | Andeen et al. | |
| 5,043,548 A | 8/1991 | Whitney et al. | |
| 5,064,685 A | 11/1991 | Kestenbaum et al. | |
| 5,164,535 A | 11/1992 | Leasure | |
| 5,170,890 A | 12/1992 | Wilson et al. | |
| 5,176,744 A | 1/1993 | Muller | |
| 5,182,430 A | 1/1993 | Lagain | |
| 5,194,297 A | 3/1993 | Scheer et al. | |
| 5,208,431 A | 5/1993 | Uchiyama et al. | |
| 5,245,404 A | 9/1993 | Jannson et al. | |
| 5,250,383 A | 10/1993 | Naruse | |
| 5,254,832 A | 10/1993 | Gartner et al. | |
| 5,270,542 A | 12/1993 | McMurry et al. | |
| 5,292,418 A | 3/1994 | Morita et al. | |
| 5,294,459 A * | 3/1994 | Hogan et al. | 427/96.2 |
| 5,322,221 A | 6/1994 | Anderson | |
| 5,335,000 A | 8/1994 | Stevens | |
| 5,344,676 A | 9/1994 | Kim et al. | |
| 5,366,559 A | 11/1994 | Periasamy | |
| 5,378,505 A | 1/1995 | Kubota et al. | |
| 5,378,508 A | 1/1995 | Castro et al. | |
| 5,403,617 A | 4/1995 | Haaland | |
| 5,425,802 A | 6/1995 | Burton et al. | |
| 5,449,536 A | 9/1995 | Funkhouser | |
| 5,486,676 A | 1/1996 | Aleshin | |
| 5,495,105 A | 2/1996 | Nishimura et al. | |
| 5,512,745 A | 4/1996 | Finer et al. | |
| 5,524,828 A * | 6/1996 | Raterman et al. | 239/413 |
| 5,547,094 A * | 8/1996 | Bartels et al. | 216/33 |
| 5,607,730 A | 3/1997 | Ranalli | |
| 5,609,921 A | 3/1997 | Gitzhofer et al. | |
| 5,612,099 A | 3/1997 | Thaler | |
| 5,614,252 A | 3/1997 | McMillan et al. | |
| 5,648,127 A | 7/1997 | Turchan et al. | |
| 5,676,719 A | 10/1997 | Stavropoulos et al. | |
| 5,732,885 A | 3/1998 | Huffman | |
| 5,733,609 A | 3/1998 | Wang | |
| 5,736,195 A | 4/1998 | Haaland | |
| 5,742,050 A | 4/1998 | Amirav et al. | |
| 5,770,272 A | 6/1998 | Biemann et al. | |
| 5,772,106 A | 6/1998 | Ayers et al. | |
| 5,772,964 A | 6/1998 | Prevost et al. | |
| 5,814,152 A | 9/1998 | Thaler | |
| 5,844,192 A | 12/1998 | Wright et al. | |
| 5,854,311 A | 12/1998 | Richart | |
| 5,861,136 A | 1/1999 | Glicksman et al. | |
| 5,882,722 A | 3/1999 | Kydd | |
| 5,894,403 A | 4/1999 | Shah et al. | |
| 5,940,099 A | 8/1999 | Karlinski | |
| 5,958,268 A | 9/1999 | Engelsberg et al. | |
| 5,965,212 A | 10/1999 | Dobson et al. | |
| 5,980,998 A | 11/1999 | Sharma et al. | |
| 5,993,549 A | 11/1999 | Kindler et al. | |
| 5,997,956 A | 12/1999 | Hunt et al. | |
| 6,007,631 A | 12/1999 | Prentice et al. | |
| 6,015,083 A | 1/2000 | Hayes et al. | |
| 6,025,037 A | 2/2000 | Wadman et al. | |
| 6,036,889 A | 3/2000 | Kydd | |
| 6,040,016 A * | 3/2000 | Mitani et al. | 239/299 |
| 6,110,144 A | 8/2000 | Choh et al. | |
| 6,116,718 A | 9/2000 | Peeters et al. | |
| 6,136,442 A | 10/2000 | Wong | |
| 6,143,116 A | 11/2000 | Hayashi et al. | |
| 6,149,076 A * | 11/2000 | Riney | 239/135 |
| 6,151,435 A | 11/2000 | Pilloff | |
| 6,159,749 A | 12/2000 | Liu | |
| 6,182,688 B1 | 2/2001 | Fabre | |
| 6,197,366 B1 | 3/2001 | Takamatsu | |
| 6,251,488 B1 | 6/2001 | Miller et al. | |
| 6,258,733 B1 | 7/2001 | Solayappan et al. | |
| 6,265,050 B1 | 7/2001 | Wong et al. | |
| 6,267,301 B1 | 7/2001 | Haruch | |
| 6,290,342 B1 | 9/2001 | Vo et al. | |
| 6,291,088 B1 | 9/2001 | Wong | |
| 6,293,659 B1 | 9/2001 | Floyd et al. | |
| 6,318,642 B1 * | 11/2001 | Goenka et al. | 239/8 |
| 6,340,216 B1 | 1/2002 | Peeters et al. | |
| 6,348,687 B1 | 2/2002 | Brockmann et al. | |
| 6,349,668 B1 | 2/2002 | Sun et al. | |
| 6,379,745 B1 | 4/2002 | Kydd et al. | |
| 6,384,365 B1 | 5/2002 | Seth et al. | |
| 6,390,115 B1 | 5/2002 | Rohwer et al. | |
| 6,391,494 B2 | 5/2002 | Reitz et al. | |
| 6,406,137 B1 | 6/2002 | Okazaki et al. | |
| 6,416,156 B1 | 7/2002 | Noolandi et al. | |
| 6,416,157 B1 | 7/2002 | Peeters et al. | |
| 6,416,158 B1 | 7/2002 | Floyd et al. | |
| 6,416,159 B1 | 7/2002 | Floyd et al. | |
| 6,416,389 B1 | 7/2002 | Perry et al. | |
| 6,454,384 B1 | 9/2002 | Peeters et al. | |
| 6,467,862 B1 | 10/2002 | Peeters et al. | |
| 6,471,327 B2 | 10/2002 | Jagannathan et al. | |
| 6,481,074 B1 | 11/2002 | Karlinski | |
| 6,503,831 B2 | 1/2003 | Speakman | |
| 6,513,736 B1 * | 2/2003 | Skeath et al. | 239/548 |
| 6,521,297 B2 | 2/2003 | McDougall et al. | |
| 6,537,501 B1 | 3/2003 | Holl et al. | |
| 6,544,599 B1 | 4/2003 | Brown et al. | |
| 6,548,122 B1 | 4/2003 | Sharma et al. | |
| 6,572,033 B1 * | 6/2003 | Pullagura et al. | 239/399 |
| 6,573,491 B1 | 6/2003 | Marchitto et al. | |
| 6,607,597 B2 | 8/2003 | Sun et al. | |
| 6,636,676 B1 | 10/2003 | Renn | |
| 6,646,253 B1 | 11/2003 | Rohwer et al. | |
| 6,772,649 B2 | 8/2004 | Zimmermann et al. | |
| 6,780,377 B2 | 8/2004 | Hall et al. | |
| 6,811,805 B2 | 11/2004 | Gilliard et al. | |
| 6,823,124 B1 | 11/2004 | Renn et al. | |
| 6,890,624 B1 | 5/2005 | Kambe et al. | |
| 6,998,785 B1 | 2/2006 | Silfvast et al. | |
| 7,045,015 B2 | 5/2006 | Renn et al. | |
| 7,108,894 B2 | 9/2006 | Renn | |
| 7,270,844 B2 | 9/2007 | Renn | |
| 7,294,366 B2 | 11/2007 | Renn et al. | |
| 7,485,345 B2 | 2/2009 | Renn et al. | |
| 7,674,671 B2 | 3/2010 | Renn et al. | |
| 7,836,922 B2 | 11/2010 | Poole et al. | |

(56) References Cited

U.S. PATENT DOCUMENTS

| | | |
|---|---|---|
| 2001/0046551 A1 | 11/2001 | Falck et al. |
| 2002/0012743 A1 | 1/2002 | Sampath et al. |
| 2002/0063117 A1 | 5/2002 | Church et al. |
| 2002/0100416 A1 | 8/2002 | Sun et al. |
| 2002/0132051 A1 | 9/2002 | Choy et al. |
| 2002/0162974 A1 | 11/2002 | Orsini et al. |
| 2003/0003241 A1 | 1/2003 | Suzuki et al. |
| 2003/0020768 A1 | 1/2003 | Renn |
| 2003/0048314 A1 | 3/2003 | Renn |
| 2003/0108511 A1 | 6/2003 | Sawhney |
| 2003/0108664 A1 | 6/2003 | Kodas et al. |
| 2003/0117691 A1 | 6/2003 | Bi et al. |
| 2003/0138967 A1 | 7/2003 | Hall et al. |
| 2003/0175411 A1 | 9/2003 | Kodas et al. |
| 2003/0180451 A1 | 9/2003 | Kodas et al. |
| 2003/0202032 A1 | 10/2003 | Moffat et al. |
| 2003/0219923 A1 | 11/2003 | Nathan et al. |
| 2003/0228124 A1 | 12/2003 | Renn et al. |
| 2004/0038808 A1 | 2/2004 | Hampden-Smith et al. |
| 2004/0080917 A1 | 4/2004 | Steddom et al. |
| 2004/0151978 A1 | 8/2004 | Huang |
| 2004/0161872 A1 | 8/2004 | Gonsiorawski et al. |
| 2004/0179808 A1 | 9/2004 | Renn |
| 2004/0197493 A1 | 10/2004 | Renn et al. |
| 2004/0227227 A1 | 11/2004 | Imanaka et al. |
| 2004/0247782 A1 | 12/2004 | Hampden-Smith et al. |
| 2005/0002818 A1 | 1/2005 | Ichikawa |
| 2005/0110064 A1 | 5/2005 | Duan et al. |
| 2005/0145968 A1 | 7/2005 | Goela et al. |
| 2005/0147749 A1 | 7/2005 | Liu et al. |
| 2005/0156991 A1 | 7/2005 | Renn |
| 2005/0163917 A1 | 7/2005 | Renn |
| 2005/0205696 A1 | 9/2005 | Saito et al. |
| 2006/0008590 A1 | 1/2006 | King et al. |
| 2006/0035033 A1* | 2/2006 | Tanahashi et al. ............ 118/300 |
| 2006/0043598 A1 | 3/2006 | Kirby et al. |
| 2006/0046347 A1 | 3/2006 | Wood et al. |
| 2006/0046461 A1 | 3/2006 | Benson et al. |
| 2006/0057014 A1 | 3/2006 | Oda et al. |
| 2006/0162424 A1 | 7/2006 | Shekarriz et al. |
| 2006/0163570 A1 | 7/2006 | Renn et al. |
| 2006/0172073 A1 | 8/2006 | Groza et al. |
| 2006/0175431 A1* | 8/2006 | Renn et al. ................... 239/296 |
| 2006/0233953 A1 | 10/2006 | Renn et al. |
| 2006/0280866 A1 | 12/2006 | Marquez et al. |
| 2007/0019028 A1 | 1/2007 | Renn |
| 2007/0128905 A1 | 6/2007 | Speakman |
| 2007/0154634 A1 | 7/2007 | Renn |
| 2007/0181060 A1 | 8/2007 | Renn et al. |
| 2008/0013299 A1 | 1/2008 | Renn |
| 2008/0099456 A1 | 5/2008 | Schwenke et al. |
| 2009/0061089 A1 | 3/2009 | King et al. |
| 2009/0114151 A1 | 5/2009 | Renn et al. |
| 2010/0173088 A1 | 7/2010 | King |
| 2010/0192847 A1 | 8/2010 | Renn et al. |
| 2010/0255209 A1 | 10/2010 | Renn et al. |
| 2011/0129615 A1 | 6/2011 | Renn et al. |
| 2013/0029032 A1 | 1/2013 | King et al. |
| 2013/0260056 A1 | 10/2013 | Renn et al. |
| 2014/0342082 A1 | 11/2014 | Renn |

FOREIGN PATENT DOCUMENTS

| | | |
|---|---|---|
| EP | 0 444 550 A2 | 9/1991 |
| EP | 0470911 | 7/1994 |
| EP | 1 258 293 | 11/2002 |
| JP | 2001-507449 | 6/2001 |
| JP | 2002539924 | 11/2002 |
| JP | 2004-122341 | 4/2004 |
| JP | 2007-507114 | 3/2007 |
| KR | 20000013770 | 3/2000 |
| KR | 1002846070000 | 8/2001 |
| KR | 10-2007-0008614 | 1/2007 |
| KR | 10-2007-0008621 | 1/2007 |
| WO | WO9633797 | 10/1996 |
| WO | WO 00/23825 | 4/2000 |
| WO | WO 00/69235 | 11/2000 |
| WO | WO-01/83101 A1 | 11/2001 |
| WO | WO 2006/041657 A2 | 4/2006 |

OTHER PUBLICATIONS

Renn, M. J. et al., "Optical-dipole-force fiber guiding and heating of atoms", *Physical Review A* May 1997, 3684-3696.

Renn, M. J. et al., "Particle manipulation and surface patterning by laser guidance", *Journal of Vacuum Science & Technology B* Nov./Dec. 1998, 3859-3863.

Renn, M. J. et al., "Particle Manipulation and Surface Patterning by Laser Guidance", *Submitted to EIPBN '98, Session AM4* 1998.

Sobeck, et al., *Technical Digest: 1994 Solid-State Sensor and Actuator Workshop* 1994, 647.

TSI Incorporated, , "How a Virtual Impactor Works", www.tsi.com Sep. 21, 2001.

Vanheusden, K. et al., "Direct Printing of Interconnect Materials for Organic Electronics", *IMAPS ATW, Printing an Intelligent Future* Mar. 8-10, 2002, 1-5.

Zhang, Xuefeng et al., "A Numerical Characterization of Particle Beam Collimation by an Aerodynamic Lens-Nozzle System: Part I. An Individual Lens or Nozzle", *Aerosol Science and Technology* vol. 36, Taylor and Francis 2002, 617-631.

Curtis, C. J. et al., "Multi-Layer Inkjet Printed Contacts for Silicon Solar Cells", Conference paper, 2006 IEEE 4th World Conference on Photovoltaic Energy Conversion, Waikoloa, Hawaii, May 2006, 1-3.

Glunz, S. W. et al., "High-efficiency crystalline silicon solar cells", Advances in OptoElectronics, vol. 2007, 2007, 1-28.

King, Bruce H. et al., "Aerosol Jet R Printing System for High Speed, Non-Contact Front Side Metallization of Silicon Solar Cells", 22nd European Photovoltaic Solar Energy Conference, Milan, Italy, 2007.

Mette, A. et al., "Increasing the Efficiency of Screen-Printed Silicon Solar Cells by Light-Induced Silver Plating", 2006 IEEE 4th World Conference on Photovoltaic Energy Conversion, May 7-12, 2006, Hawaii, May 2006.

Mette, A. et al., "Metal Aerosol Jet Printing for Solar Cell Metallization", Progress in Photovoltaics: Research and Applications, vol. 15, Wiley InterScience, Apr. 5, 2007, 621-627.

Mette, Ansgar et al., "Novel Metal Jet Printing Technique for the Front Side Metallization of Highly Efficient Industrial Silicon Solar Cells", 21st European Photovoltaic Solar Energy Conference, Dresden, Germany, 2006.

* cited by examiner

APPARATUS FOR ANISOTROPIC FOCUSING

CROSS-REFERENCE TO RELATED APPLICATIONS

This application claims the benefit of the filing of U.S. Provisional Patent Application Ser. No. 60/969,445, entitled "Apparatus for Anisotropic Focusing", filed on Aug. 31, 2007, the specification of which is incorporated herein by reference.

BACKGROUND OF THE INVENTION

1. Field of the Invention (Technical Field)

The present invention relates to the field of anisotropic focusing of material streams using asymmetric tip geometries.

2. Description of Related Art

The prior art generally relates to apparatuses and methods for high-resolution, maskless deposition of liquid and liquid-particle suspensions using aerodynamic focusing. In the most commonly used embodiment, an aerosol stream is focused and deposited onto a planar or non-planar target, forming a pattern that is thermally or photochemically processed to achieve physical, optical, and/or electrical properties near that of the corresponding bulk material. The process is called $M^3D$® (Maskless Mesoscale Material Deposition) technology, and is used to deposit aerosolized materials with linewidths that are orders of magnitude smaller than lines deposited with conventional thick film processes. Deposition is performed without the use of masks. Furthermore, the $M^3D$® process is capable of defining lines having widths smaller than 1 micron.

The $M^3D$® apparatus preferably uses an aerosol jet deposition head to form an annularly propagating jet composed of an outer sheath flow and an inner aerosol-laden carrier flow. In the annular aerosol jetting process, the aerosol stream enters the deposition head, preferably either directly after the aerosolization process or after passing through a heater assembly, and is directed along the axis of the device towards the deposition head orifice. The mass throughput is preferably controlled by an aerosol carrier gas mass flow controller. Inside the deposition head, the aerosol stream is preferably initially collimated by passing through a millimeter-size orifice. The emergent particle stream is then preferably combined with an annular sheath gas, which functions to eliminate clogging of the nozzle and to focus the aerosol stream. The carrier gas and the sheath gas most commonly comprise compressed air or an inert gas, where one or both may contain a modified solvent vapor content. For example, when the aerosol is formed from an aqueous solution, water vapor may be added to the carrier gas or the sheath gas to prevent droplet evaporation.

The sheath gas preferably enters through a sheath air inlet below the aerosol inlet and forms an annular flow with the aerosol stream. As with the aerosol carrier gas, the sheath gas flowrate is preferably controlled by a mass flow controller. The combined streams exit the nozzle at a high velocity (~50 m/s) through an orifice directed at a target, and subsequently impinge upon it. This annular flow focuses the aerosol stream onto the target and allows for deposition of features with dimensions smaller than approximately 1 micron. Patterns are formed by moving the deposition head relative to the target.

Prior art related to the $M^3D$ method has disclosed apparatuses that generally use the technique of coaxial sheath flow. FIG. 1 shows the simplest geometry of concentric tubes. Innermost mist tube 10 carries the atomized material in an aerosol mist flow. Tube 10 is concentrically mounted to outer shell 12 at the proximal position 14 of assembly 16. The annular space between mist tube 10 and shell 12 forms coaxial sheath chamber 18. Sheath gas enters sheath chamber 18 at proximal location 20 such that by the time the sheath gas has traveled the length of the sheath chamber 18, the gas has established a fully developed laminar flow coaxial with the mist flow. The mist and sheath flows meet in convergence zone 22 where hydrodynamic focusing occurs. Distal cone 24 of the convergence zone 22 provides additional geometric focusing. Tip 26 may be added to assembly 16 to provide additional geometric focusing.

Liquid flow cytometry also uses hydrodynamic focusing to organize a sample flow into an extremely thin line typically to be optically analyzed. Unlike the aerosol and gas sheath $M^3D$ method, flow cytometry uses only liquid, thus benefiting from the incompressibility of liquid and laminar flow to focus sample material. The liquid sample (typically a preprocessed blood sample, analogous to the aerosol stream in the $M^3D$® method) is focused by a liquid sheath which is typically de-ionized water or saline solution. Typically, the liquid sample is focused down to approximately a 10 micron width so that biological cells of interest are nearly aligned sequentially. From the focusing chamber, these cells directly enter an optically clear and typically square tube with an inner square chamber about 250 microns square. The square flow cell is not used to additionally focus the cells. In some cases, laser light is directed through one surface of the flow cell and an optical detector is positioned opposite the laser and one perpendicular to laser, to detect both the reflected and refracted light as the laser beam passes thru the focused sample stream. Since the sample is essentially a sequential train of cells, the changing light patterns can be analyzed and different cells can be detected and counted. Further, with special equipment the stream of cells can then be sorted and deposited into separate chambers. The construction of the focusing and optical chambers (typically called "flow cells") are well known to the flow cytometry community and have the disadvantage of difficult alignment of the focusing chamber to the entrance of the optical chamber; with the further disadvantage of high cost. In most applications, these flow cells need to be rewashed and reused rather than thrown away. The disadvantages of reuse are obvious: cross-contamination and wasted time. Flow cytometers are also known for being relatively large in size and complexity having to pump, valve and meter various flows. When handling potentially harmful biological fluids, it can be extremely difficult and hazardous to load, unload and service these instruments.

Disposable planar liquid handling assemblies are also well known to the field of flow cytometry as is exemplified in U.S. Pat. No. 6,537,501. Rather than have many tubes and separate valves, small liquid handling cassettes are available that use many thin layers of typically plastic materials. Each layer may have different chambers of fluid paths or simply be barriers to separate one channel from another. When oriented properly and assembled, a fluidic "circuit board" is created where fluids can flow from one layer to another. With this layered approach, 2-dimensional focusing chambers have been used to focus a sample fluid into an optical chamber.

BRIEF SUMMARY OF THE INVENTION

The present invention is a material deposition assembly comprising a first cover plate and a second cover plate, either or both of the cover plates comprising an inlet for an aerosol comprising a material and one or more sheath gas inlets; an insert sealed between the cover plates, the insert comprising at least one aerosol channel in fluid connection with the aerosol inlet and an anisotropic nozzle; wherein the one or more sheath gas inlets are in fluid connection with a sheath plenum enclosing an exit of the at least one aerosol channel and an entrance of the nozzle. The insert preferably comprises two mirror imaged plates which when assembled together form the aerosol channel and the nozzle. The sheath gas preferably surrounds and focuses the aerosol in the sheath plenum and the nozzle. The sheath plenum is preferably anisotropic. The nozzle is preferably rectangular and the aerosol channel is preferably rectangular and preferably aligned with the rectangular nozzle. The nozzle is preferably moveable relative to a substrate during deposition of the material, and is optionally tiltable with respect to a relative direction of travel of the nozzle and the substrate. The deposition assembly preferably further comprises channels connecting the one or more sheath gas inlets and the sheath plenum, the channels configured so that the sheath gas enters the sheath plenum travelling in a direction substantially parallel to a flow direction of the aerosol in the aerosol channel.

The insert optionally comprises a tip shim comprising an aerosol channel. The tip shim is preferably deformable, and deformation of the tip shim preferably varies a width of a tip of the aerosol channel.

At least a portion of the at least one aerosol channel optionally comprises alternating offset dividers or is optionally subdivided into a plurality of smaller sub-channels. The sub-channels are preferably aligned axially and arranged in two rows, the sub-channels in a first row offset from the sub-channels in a second row. The sub-channels in the first row are optionally angled with respect to the sub-channels in the second row, in which case the individual aerosol flows in adjacent sub-channels preferably cross when exiting the aerosol channel.

Objects, advantages and novel features, and further scope of applicability of the present invention will be set forth in part in the detailed description to follow, taken in conjunction with the accompanying drawing, and in part will become apparent to those skilled in the art upon examination of the following, or may be learned by practice of the invention. The objects and advantages of the invention may be realized and attained by means of the instrumentalities and combinations particularly pointed out in the appended claims.

BRIEF DESCRIPTION OF THE SEVERAL VIEWS OF THE DRAWINGS

The accompanying drawings, which are incorporated into and form a part of the specification, illustrate one or more embodiments of the present invention and, together with the description, serve to explain the principles of the invention. The drawings are only for the purpose of illustrating one or more preferred embodiments of the invention and is not to be construed as limiting the invention. In the drawings.

DETAILED DESCRIPTION OF THE INVENTION

Figure 1:
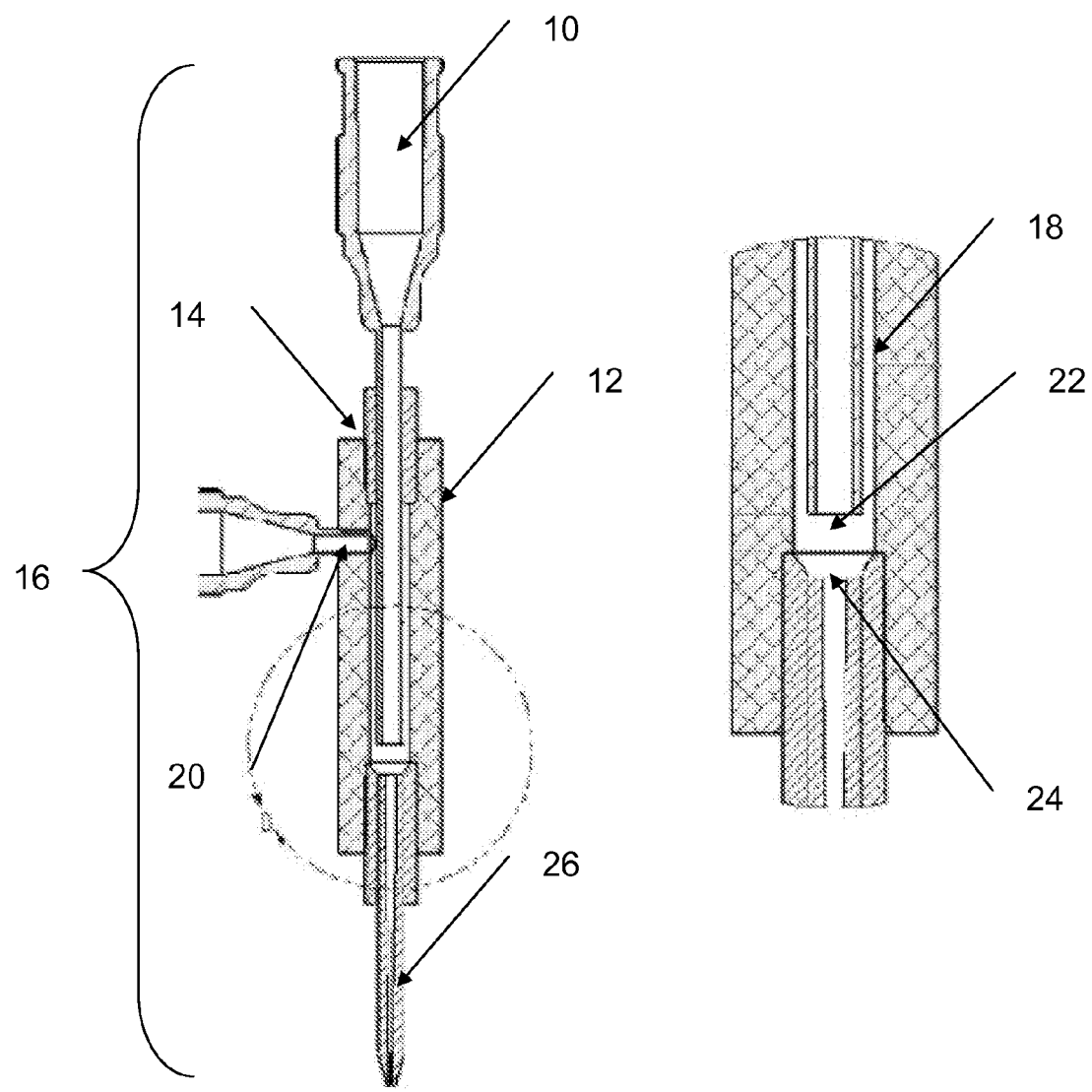
FIG. 1 is a schematic of the prior art nano deposition head using concentric tubes.

The present invention relates to an apparatus and method for anisotropic focusing of material flows using asymmetric nozzle geometries. One straightforward method to construct such a device is to extrude two coaxial rectangular tubes; assemble them similar to the concentric tube configuration of FIG. 1, then attach a smaller rectangular tip tube again similar to the design shown in FIG. 1. The present invention preferably utilizes planar assemblies, which provide great flexibility in channel design as well as enabling construction an array of focusing nozzles with common mist; sheath and waste plenums. Rectangular nozzles are only one example of tip geometries that are possible with these planar assemblies.

Figure 2:
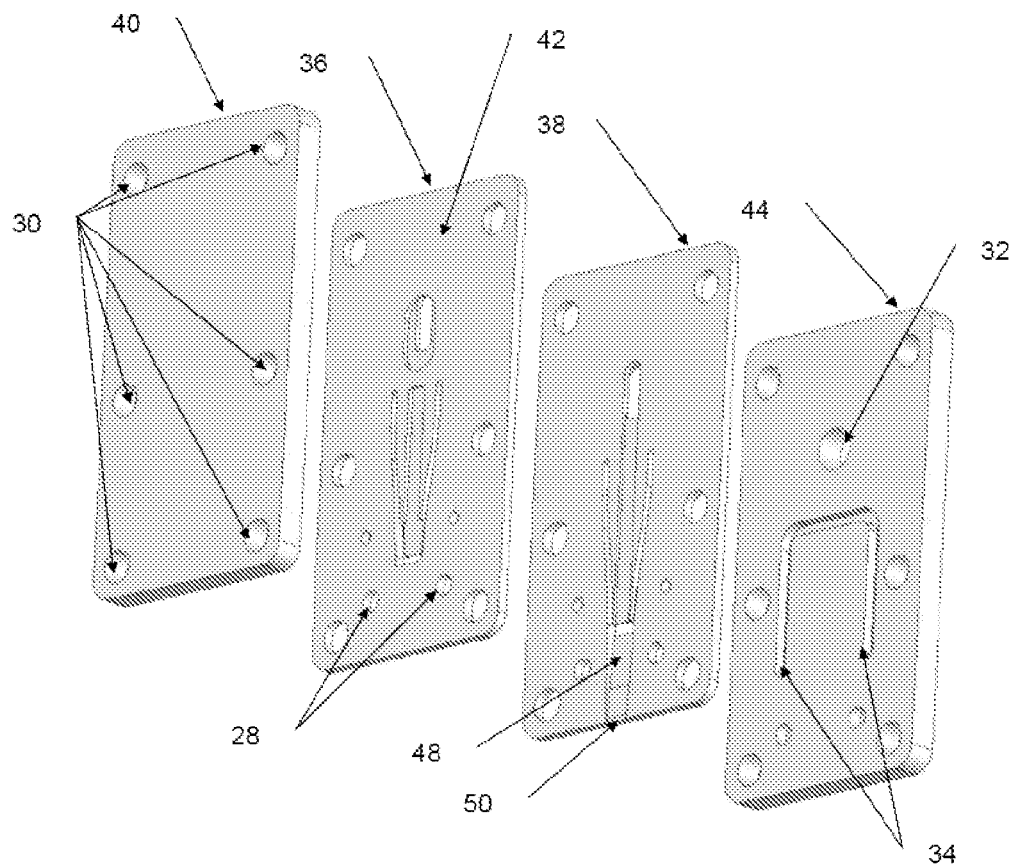
FIG. 2 is an exploded view schematic of a planar assembly of a rectangular nozzle configuration.

FIG. 2 shows an exploded view of one embodiment of a rectangular nozzle planar assembly that exhibits anisotropic focusing. All four layers are preferably aligned with dowel pins disposed in the two alignment holes 28. The layers are preferably sealed together using only compression via six screws in holes 30. For compression sealing to function, all mating surfaces must be well finished and preferably polished. Alternatively, if the target is capable of exhibiting some deformation during compression, such as a high durometer plastic substrate, then most minor imperfections and scratches would be sealed by surrounding deformed material. The risk of using too soft a substrate is that the compression required to seal the assembly may significantly affect nozzle geometries. Any other method of sealing the assembly, including but not limited to gaskets and/or adhesive, may alternatively be employed.

Figure 3:
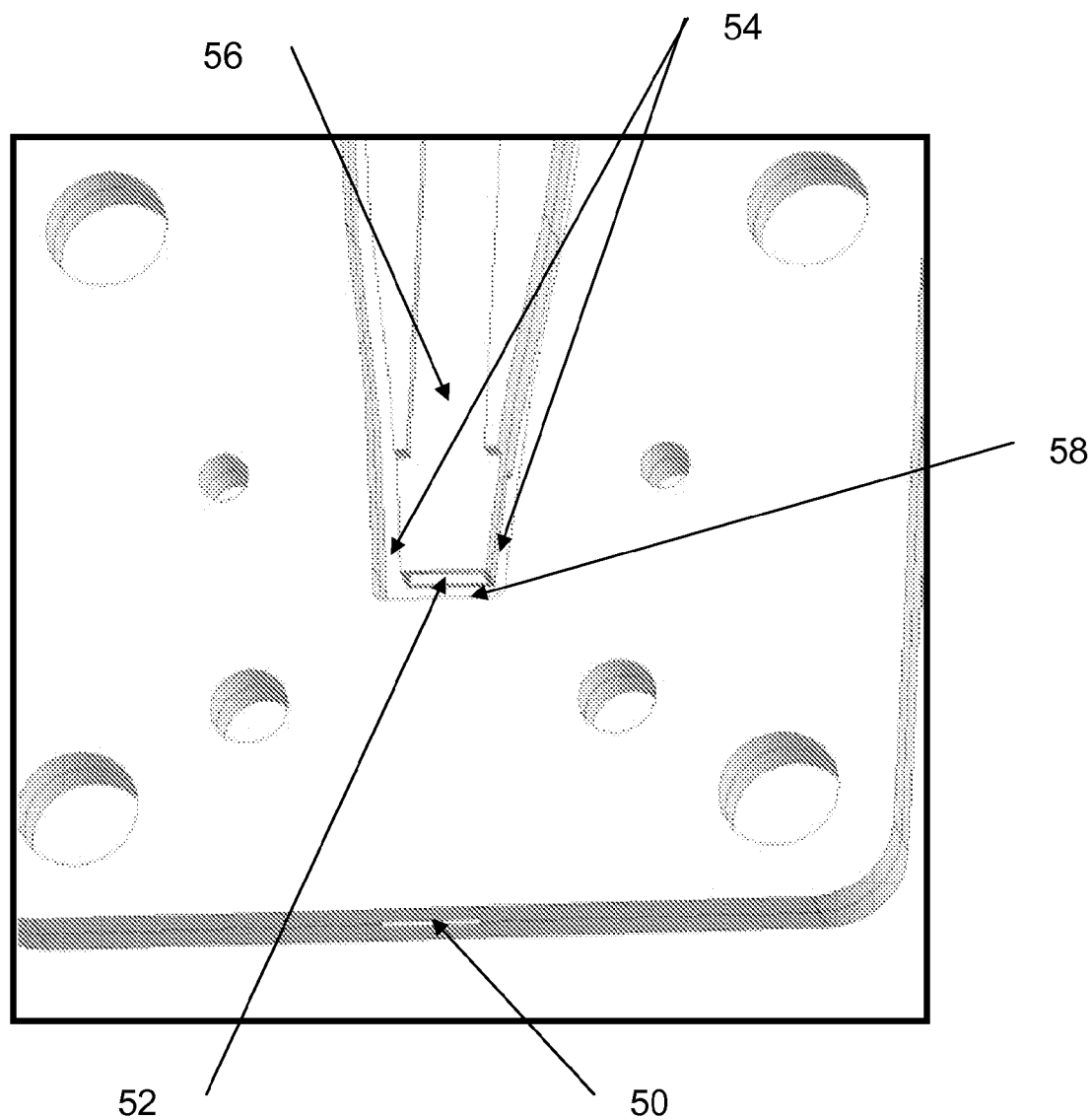
FIG. 3 is a schematic of a planar assembly without a tube.

Aerosol mist enters the assembly thru mist port 32. Sheath gas enters the assembly thru sheath port 34. There are two identical mist channel plates 36 and 38, which when assembled in the mirrored configuration detailed in FIG. 3, form rectangular mist channel 52. Top plate 40 seals against surface 42 of mist channel plate 36. Bottom plate 44 seals against back surface of mist channel plate 38 (not visible in FIG. 2). In FIG. 3, when top and bottom plates 40 and 44 (not shown in FIG. 3) are assembled, sheath plenums are formed around each side 54, top 56 and bottom (not visible) of mist channel 52. Convergence zone 58 is an area of mostly anisotropic hydrodynamic focusing. Anisotropic geometric focusing takes place in zone 48 shown in FIG. 2. The flow exits the nozzle at tip 50.

A rectangular tip is useful for applications such as conformal coating because it provides a wide, flat spray pattern. This tip focuses the mist asymmetrically, thus providing a wider linewidth if the head travels in the direction perpendicular to the longer sides, and a narrower linewidth if the head travels in the direction perpendicular to the shorter sides. The latter pattern will produce an increased deposit thickness because it is depositing more material over itself. This is also the case for a multi-nozzle deposition head that is used in a similar fashion. Any pattern width in between can be achieved by angling the head versus the direction of material deposition. Also, using a rectangular mist channel (instead of a round tube or square channel typically used) improves the uniformity of the deposition pattern effect if oriented in the same direction as the rectangular nozzle tip. The sheath flow is required to minimize the potential for tip clogging and to focus the mist aerosol to create a smaller deposition pattern (thin line) when depositing in the same direction as the thin axis of the rectangular nozzle tip.

Figure 4:
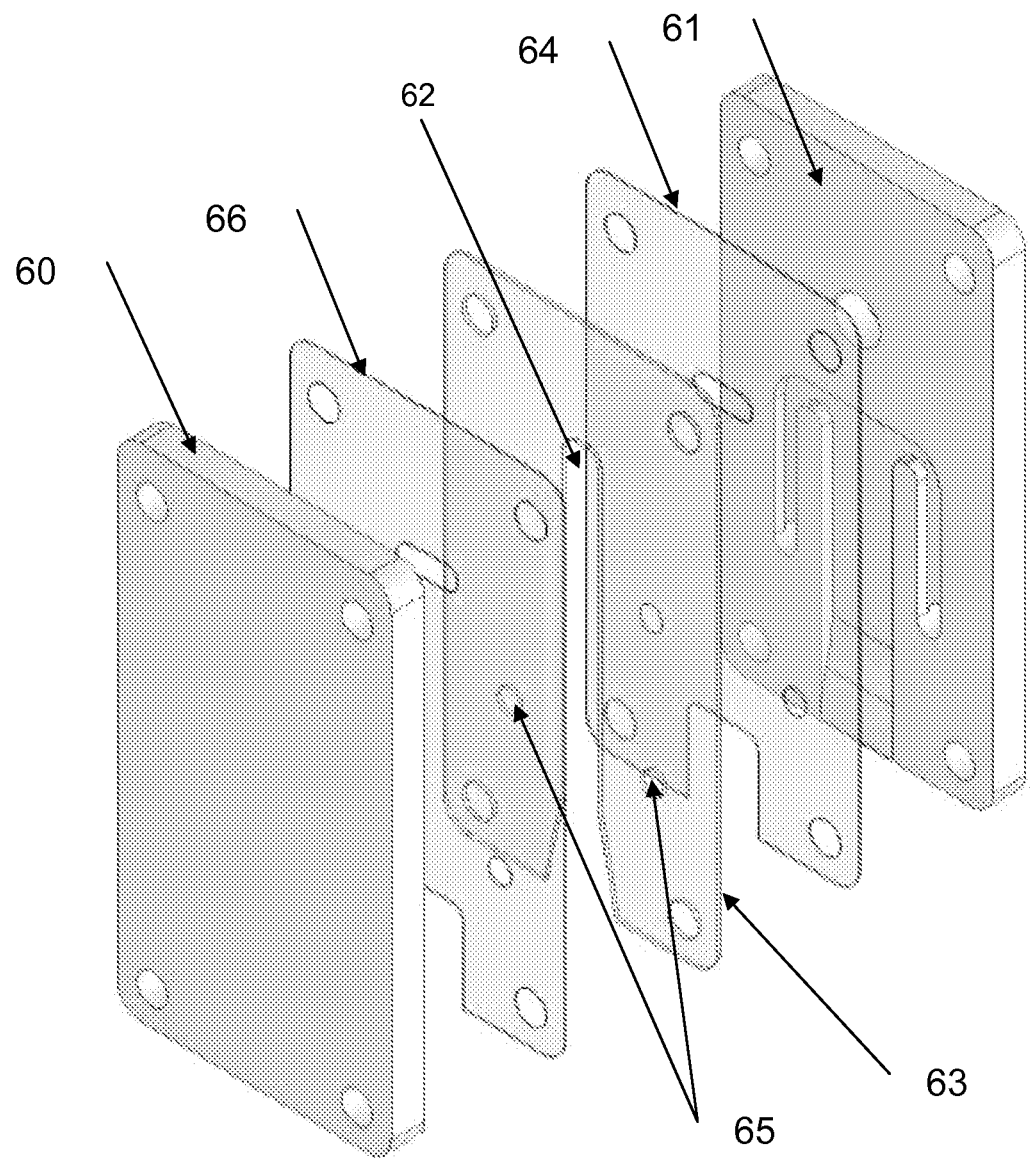
FIG. 4 is a schematic of another embodiment of a planar assembly without a tube.

FIG. 4 shows an embodiment in which top plate 60 and bottom plate 61 are nearly identical, and mist channel 62 is defined by sandwiching a tip shim 63 between two identical sheath shims 64, 66. Such a nozzle allows the same planar assembly to be used for the manifold mist, gas, and waste, while a different tip-shim 63 layer can be used for different applications. This tip-shim can be manufactured by stamping, machining, laser cutting, wire EDM, photoetching, or any other manufacturing technique. Further, a single tip-shim configuration can be made of deformable material such as annealed stainless steel or high durometer plastic with a common mist channel width, for example 1 mm wide. During the manufacturing process the distance between alignment pins 65 can be set to achieve the desired width of the distal tip of mist channel 62, thus changing the width of the deposited line. Furthermore, assuming the seal between the layers can be maintained, or the user can accept a brief interruption in proper material focusing, then this tip could deposit different line widths simply by moving the alignment pins 65 to increase the tip width without having to change the nozzle or rotate the nozzle.

Flow Straightening

Figure 5:
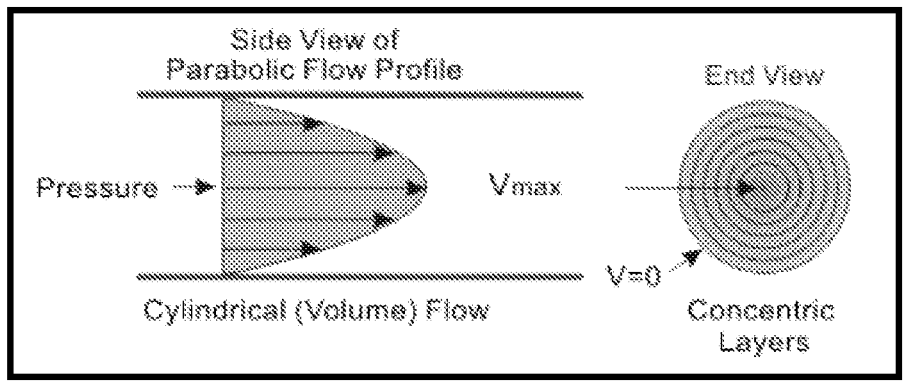
FIG. 5 is a diagram explaining laminar flow profile.
Figure 6:
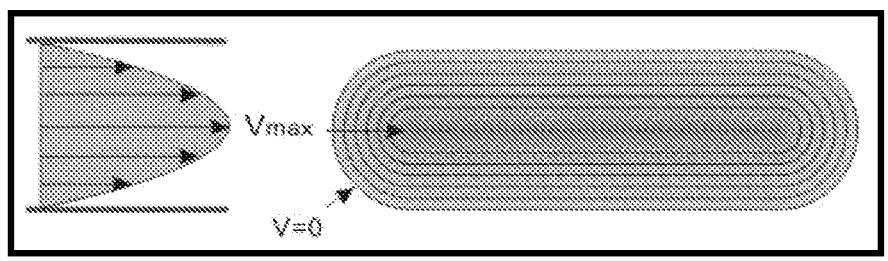
FIG. 6 is a diagram showing the deposition pattern resulting from the flow profile shown in FIG. 5.
Figure 7:
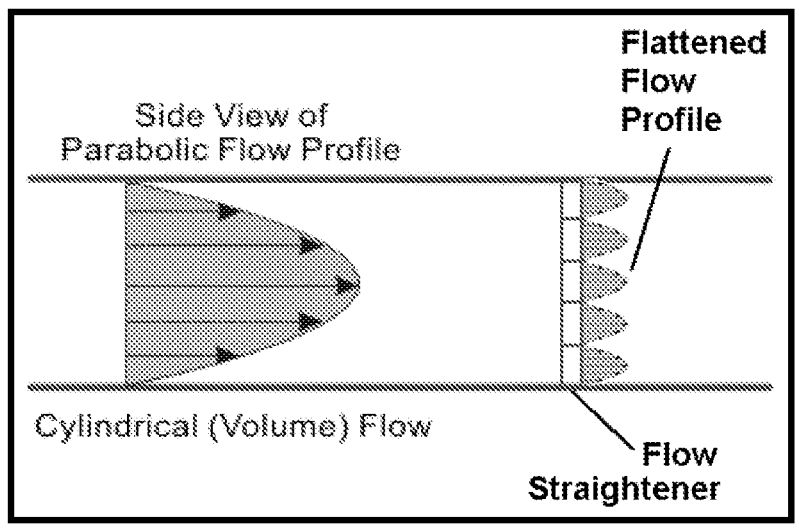
FIG. 7 is a diagram explaining flow straightening.
Figure 8:
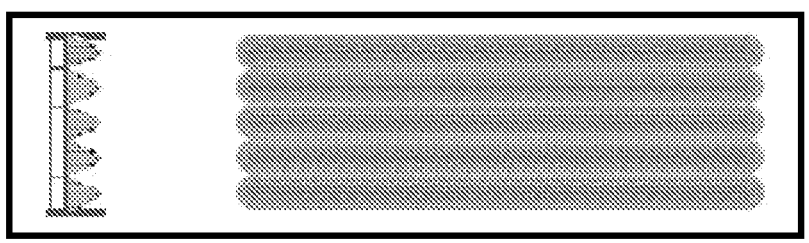
FIG. 8 is a diagram showing the many small laminar flow patterns close together.

Laminar flow within a nozzle contributes to non-uniform deposition of material because the velocity of material in the center of the flow is greater than the edges, as shown in FIG. 5. Thus more material is deposited at the center of the pattern than the edges. When the substrate is moving relative to the nozzle, a non-uniform deposition pattern results as shown in FIG. 6, in which more material is deposited in the center of the pattern than along the edges. Laminar flow is preferable to turbulent flow, however, since the latter typically produces poor focusing and poor edge definition. Flow straightening improves the deposition uniformity of laminar flow, especially for wide patterns. Flow straightening is well known in the field of fluid mechanics and is an established method of reducing turbulence in large bore tubes and to make a laminar flow profile more uniform, as shown in FIGS. 7 and 8.

Figure 9:
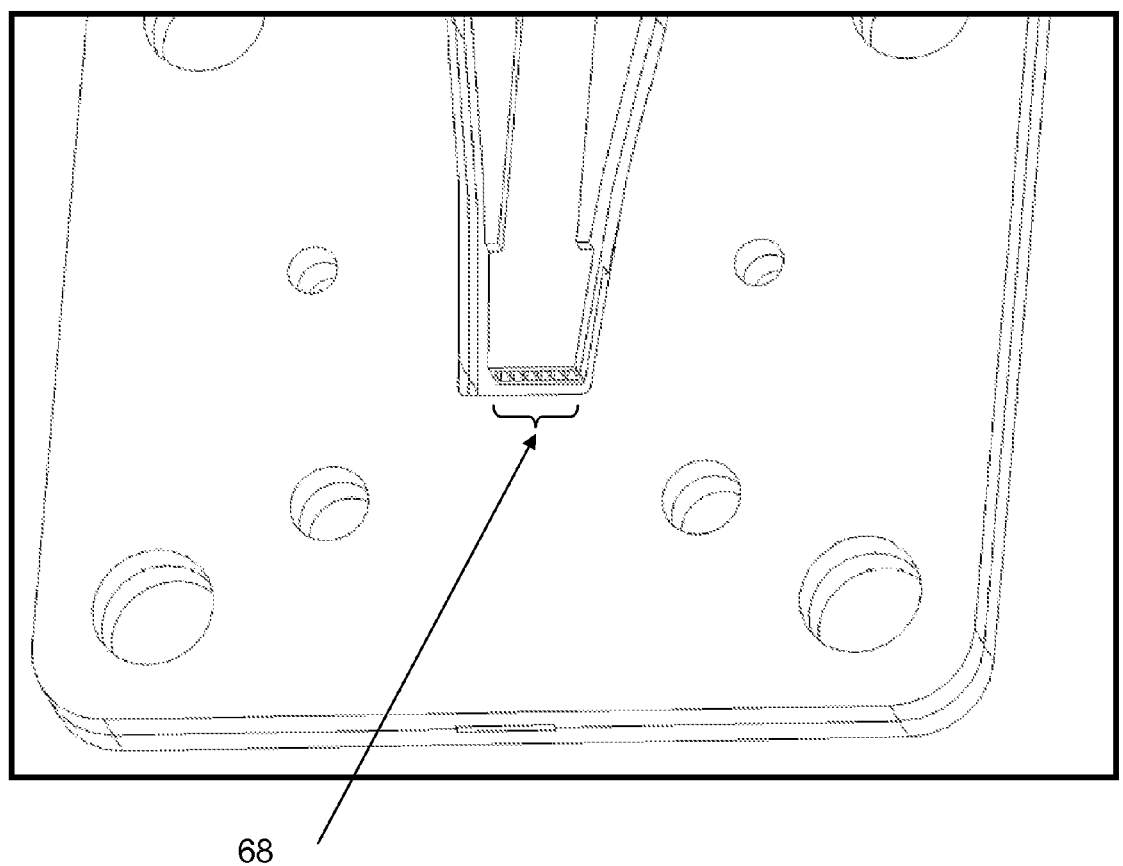
FIG. 9 is a schematic showing the multiple square geometry channels within the mist channel.
Figure 10:
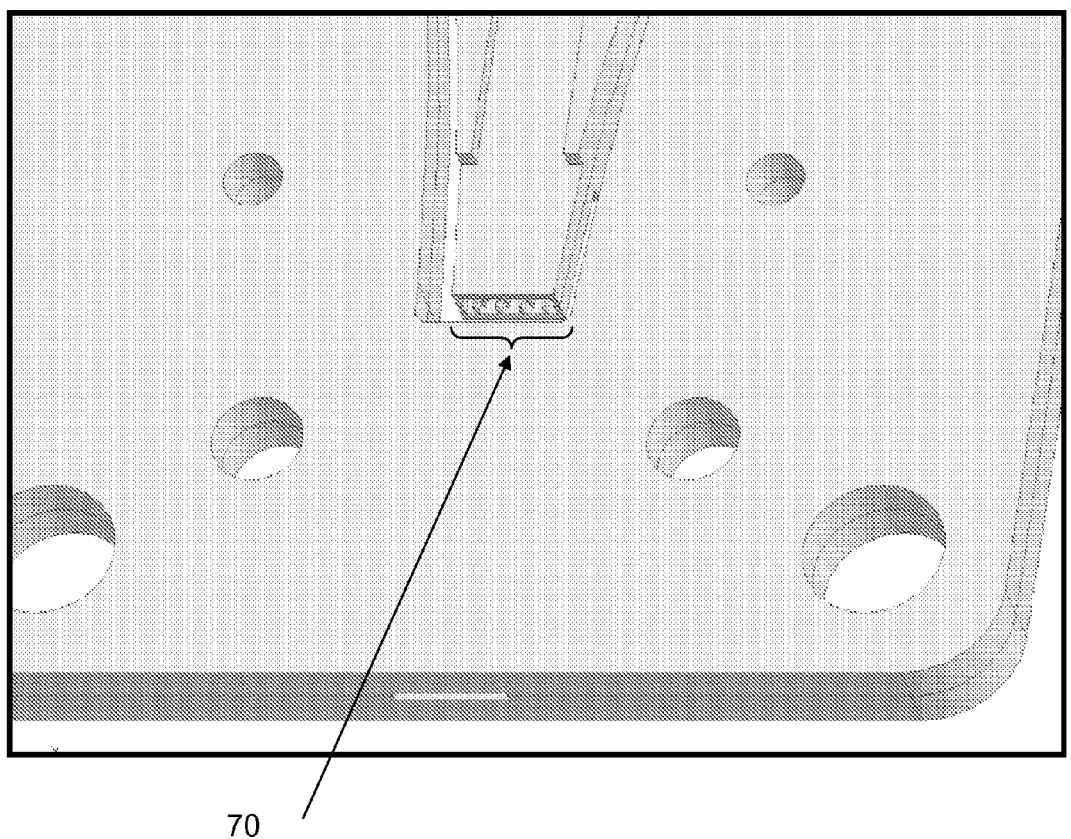
FIG. 10 is a schematic showing multiple channels within the mist channel of a different geometry than FIG. 9.
Figure 11:
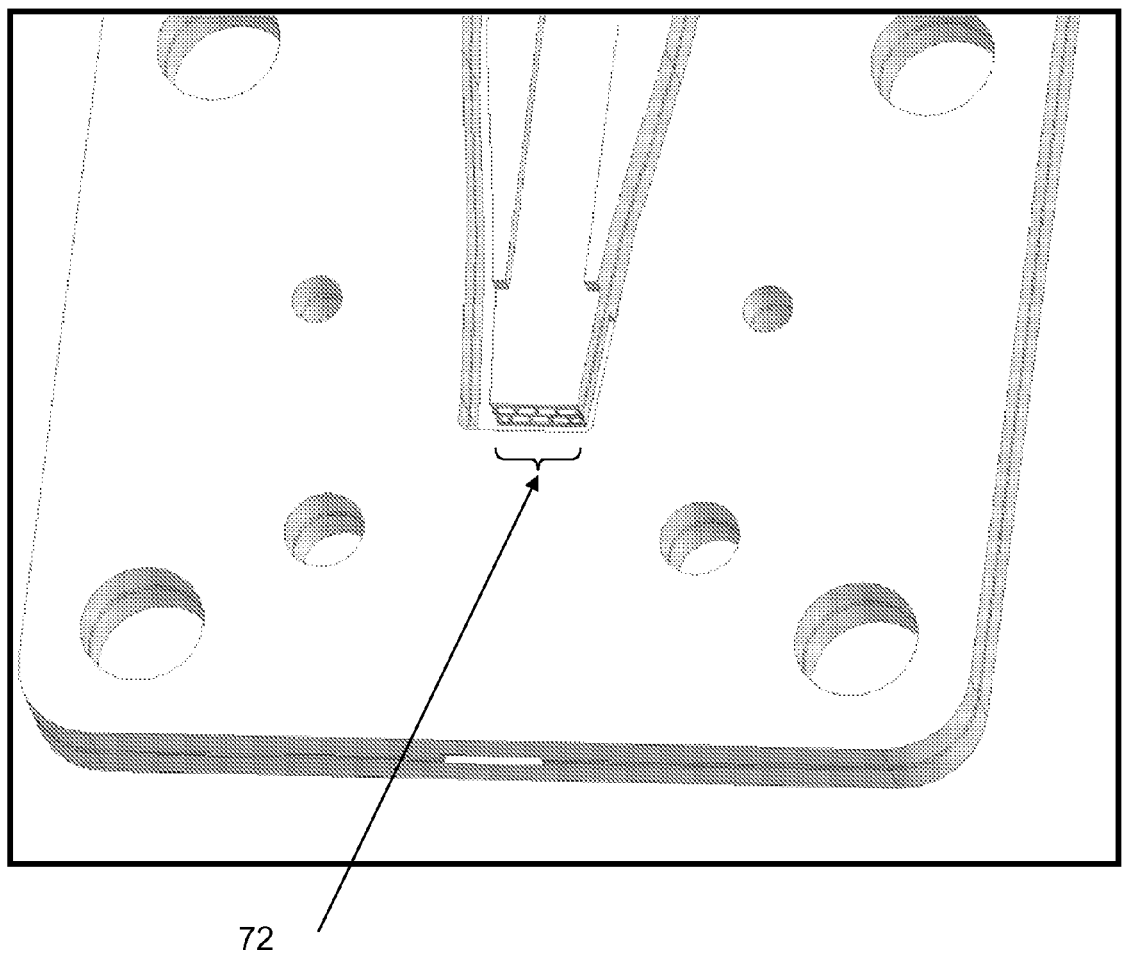
FIG. 11 is a schematic showing multiple channels within the mist channel of a different geometry than FIG. 9 and FIG. 10.

In one configuration for achieving "straightening" of a laminar flow profile, the wide rectangular mist channel is aligned with a wide rectangular tip. The mist channel is divided into a plurality of smaller sub-channels 68 as shown in FIG. 9. The sub-channels may be rectangular, round, square, or comprise any other shape. The mist channel may be alternatively comprise any other geometry, such as alternating offset dividers 70 as shown in FIG. 10, to achieve a more uniform flow pattern. Similar to the patterns shown in FIGS. 7 and 8, this configuration results in smaller ripples in the deposition density due to the many small laminar flow patterns deposited close to each other. Such ripples can be reduced by placing another row of mist sub-channels, offset from the first, such that the middle of a channel in one row is directly above the walls of adjacent channel of the lower row, as shown in FIG. 11. FIG. 11 shows sub-channels 72 aligned axially. The localized uniformity may be further improved by angling one row of channels with respect to the other, thus crossing the individual flows just as the flow is entering the anisotropic focusing region.

An embodiment alternative to subdividing the mist channel is to use multiple adjacent mist tubes or channels, of any shape, that are lined up and feed a single wide nozzle. In this embodiment, there is preferably a single sheath plenum common to all of the tubes or channels.

Although the invention has been described in detail with particular reference to these preferred embodiments, other embodiments can achieve the same results. Variations and modifications of the present invention will be obvious to those skilled in the art and it is intended to cover in the appended claims all such modifications and equivalents. The entire disclosures of all references, applications, patents, and publications cited above are hereby incorporated by reference.

What is claimed is:

1. A material deposition assembly comprising:
   a sheath gas plenum;
   at least one aerosol channel comprising a rectangular opening, said channel disposed concentrically within and surrounded by said sheath gas plenum;
   a convergence zone wherein a sheath gas forms a combined stream comprising an outer annular sheath flow and an inner aerosol-laden carrier flow by directly surrounding and focusing an aerosol exiting said opening;
   a nozzle comprising a rectangular cross section for transporting the combined stream;
   a first cover plate and a second cover plate, either or both of said cover plates comprising an inlet for an aerosol comprising a material and one or more sheath gas inlets; and
   an insert sealed between said cover plates, said insert comprising said at least one aerosol channel, said at least one aerosol channel in fluid connection with said aerosol inlet and said nozzle;
   wherein said one or more sheath gas inlets are in fluid connection with said sheath gas plenum, said sheath gas plenum enclosing an exit of said at least one aerosol channel and an entrance of said nozzle; and
   wherein said insert comprises two mirror imaged plates which when assembled together form said at least one aerosol channel and said nozzle.

2. The material deposition assembly of claim 1 wherein dimensions of said sheath gas plenum are anisotropic.

3. The material deposition assembly of claim 1 wherein said at least one aerosol channel is aligned with said nozzle.

4. The material deposition assembly of claim 1 further comprising channels connecting said one or more sheath gas inlets and said sheath gas plenum, said channels configured so that a sheath gas enters said sheath gas plenum travelling in a direction substantially parallel to a flow direction of said aerosol in said at least one aerosol channel.

5. The material deposition assembly of claim 1 wherein said insert comprises a tip shim comprising said at least one aerosol channel.

6. The material deposition assembly of claim 5 wherein said tip shim comprises a deformable material.

7. The material deposition assembly of claim 6 wherein deformation of said tip shim varies a width of a tip of said at least one aerosol channel.

8. The material deposition assembly of claim 1 wherein at least a portion of said at least one aerosol channel is subdivided into a plurality of smaller sub-channels.

9. The material deposition assembly of claim 8 wherein said sub-channels are aligned axially and arranged in two rows, the sub-channels in a first row offset from the sub-channels in a second row.

10. The material deposition assembly of claim 9 wherein the sub-channels in said first row are angled with respect to the sub-channels in said second row.

11. The material deposition assembly of claim 10 wherein the individual aerosol flows in adjacent sub-channels cross when exiting said at least one aerosol channel.

12. The material deposition assembly of claim 1 wherein at least a portion of said at least one aerosol channel comprises alternating offset dividers.

* * * * *